United States Patent
Barlow et al.

(10) Patent No.: US 11,217,659 B1
(45) Date of Patent: Jan. 4, 2022

(54) DIRECT APPLICATION ADDITIVE MANUFACTURING FOR CONDUCTIVE WAFER INTERCONNECT

(71) Applicants: Matthew W. Barlow, Springdale, AR (US); Nicholas J. Chiolino, Springdale, AR (US); Anthony M. Francis, Elkins, AR (US); James A. Holmes, Fayetteville, AR (US)

(72) Inventors: Matthew W. Barlow, Springdale, AR (US); Nicholas J. Chiolino, Springdale, AR (US); Anthony M. Francis, Elkins, AR (US); James A. Holmes, Fayetteville, AR (US)

( * ) Notice: Subject to any disclaimer, the term of this patent is extended or adjusted under 35 U.S.C. 154(b) by 0 days.

(21) Appl. No.: 16/751,681

(22) Filed: Jan. 24, 2020

Related U.S. Application Data

(60) Provisional application No. 62/796,118, filed on Jan. 24, 2019.

(51) Int. Cl.
| | | |
|---|---|---|
| *H01L 21/00* | (2006.01) | |
| *G01L 9/00* | (2006.01) | |
| *H01L 49/02* | (2006.01) | |
| *H01L 21/66* | (2006.01) | |
| *H01L 27/144* | (2006.01) | |
| *H01L 51/00* | (2006.01) | |
| *H01L 21/768* | (2006.01) | |

(52) U.S. Cl.
CPC ........ *H01L 28/20* (2013.01); *H01L 21/76817* (2013.01); *H01L 22/20* (2013.01); *H01L 27/1443* (2013.01); *H01L 27/1446* (2013.01); *H01L 51/0013* (2013.01)

(58) Field of Classification Search
CPC ...................... H01L 51/0013; H01L 21/76817
USPC ............................. 438/50–53; 257/417–420
See application file for complete search history.

(56) References Cited

U.S. PATENT DOCUMENTS

| | | | |
|---|---|---|---|
| 7,806,974 B2 | 10/2010 | Hwang et al. | ............. 106/31.92 |
| 7,952,107 B2 | 5/2011 | Daniels et al. | ................. 257/80 |
| 9,123,705 B2 | 9/2015 | Blanchard et al. | |
| 9,631,106 B2 | 4/2017 | Maaninen et al. | ............ 252/500 |
| 9,803,098 B2 | 10/2017 | Cho et al. | ................... 106/31.92 |
| 9,899,298 B2 | 2/2018 | Vincent et al. | |
| 2021/0121101 A1* | 4/2021 | Singhala et al. | ...... H05K 1/0386 |

\* cited by examiner

*Primary Examiner* — Calvin Lee
(74) *Attorney, Agent, or Firm* — Keisling & Pieper PLC; David B. Pieper; Trent C. Keisling

(57) ABSTRACT

An improved silicon carbide wafer using direct application conductive ink interconnects positioned on printing connection pads. The conductive ink interconnected can be routed to form a custom length resistive trace for a device after fabrication and measurement of the device.

1 Claim, 4 Drawing Sheets

DIRECT APPLICATION ADDITIVE MANUFACTURING FOR CONDUCTIVE WAFER INTERCONNECT

CROSS-REFERENCE TO RELATED APPLICATIONS

This application claims priority to and is a continuation-in-part of U.S. Patent Application Ser. No. 62/796,118, filed on Jan. 24, 2019 entitled DIRECT APPLICATION ADDITIVE MANUFACTURING FOR CONDUCTIVE WAFER INTERCONNECT which is hereby incorporated by reference in its entirety.

STATEMENT REGARDING FEDERALLY SPONSORED RESEARCH OR DEVELOPMENT

This invention was made with government support by Small Business Innovation Research (SBIR) and Small Business Technology Transfer (STTR), SBIR/STTR-GTC-0024 with cooperative agreement DE-SC0017731. The government has certain rights in the invention.

REFERENCE TO A MICROFICHE APPENDIX

Not Applicable.

RESERVATION OF RIGHTS

A portion of the disclosure of this patent document contains material which is subject to intellectual property rights such as but not limited to copyright, trademark, and/or trade dress protection. The owner has no objection to the facsimile reproduction by anyone of the patent document or the patent disclosure as it appears in the Patent and Trademark Office patent files or records but otherwise reserves all rights whatsoever.

BACKGROUND OF THE INVENTION

1. Field of the Invention

The present invention relates to improvements in on wafer conductive interconnects. More particularly, the invention relates to improvements particularly suited for simplified customization and reduced processing in wafer circuit manufacturing. In particular, the present invention relates specifically to the use of interconnect pads which provide micro printing of electrical traces, conductors, and interconnects.

2. Description of the Known Art

As will be appreciated by those skilled in the art, electrically conductive ink is known in various forms. Patents disclosing information relevant to conductive ink include:

U.S. Pat. No. 9,899,298, issued to Vincent, et al. on Feb. 20, 2018 entitled Microelectronic packages having mold-embedded traces and methods for the production thereof. The abstract reads as follows: Methods for fabricating microelectronic packages, such as Fan-Out Wafer Level Packages, and microelectronic packages are provided. In one embodiment, the method includes placing a first semiconductor die on a temporary substrate, forming an electrically-conducive trace in contact with at least one of the first semiconductor die and the temporary substrate, and encapsulating the first semiconductor die and the electrically-conductive trace within a molded panel. The temporary substrate is removed to reveal a frontside of the molded panel through which the electrically-conducive trace is at least partially exposed. At least one redistribution layer is formed over the frontside of the molded panel, the at least one redistribution layer comprises an interconnect line in ohmic contact with the electrically-conducive trace.

U.S. Pat. No. 7,952,107, issued to Daniels, et al. on May 31, 2011 entitled Solid state light sheet and encapsulated bare die semiconductor circuits with electrical insulator. This patent describes "At least one of the first and the second substrate may be a flexible plastic sheet, such as PET, PEN, Kapton, polycarbonate, vinyl, and the like. At least one of the first, second and third wiring line can be formed from a printed conductive ink, such as through silk screen, inkjet, gravure, donor sheet, electrostatic or other printing methods."

Other patents include U.S. Pat. No. 9,803,098, issued to Cho, et al. on Oct. 31, 2017 entitled Conductive ink; U.S. Pat. No. 9,631,106, issued to Maaninen, et al. on Apr. 25, 2017 entitled Conductive ink and conductor; U.S. Pat. No. 9,123,705, issued to Blanchard, et al. on Sep. 1, 2015 entitled Conductive ink for filling vias; and U.S. Pat. No. 7,806,974 issued to Hwang, et al. on Oct. 5, 2010 entitled Highly conductive ink composition and method for fabricating a metal conductive pattern.

Each of the aforementioned patents is hereby expressly incorporated by reference in their entirety.

From these prior references it may be seen that these prior art patents are very limited in their teaching and utilization, and an improved direct application conductive ink interconnect wafer is needed to overcome these limitations.

SUMMARY OF THE INVENTION

The present invention is directed to an improved wafer using direct application conductive ink interconnects positioned on printing connection pads. In accordance with one exemplary embodiment of the present invention, a printing connection pad is provided for a resistive trace. In accordance with one exemplary embodiment of the present invention, a printing connection pad is provided for a routing trace. These and other objects and advantages of the present invention, along with features of novelty appurtenant thereto, will appear or become apparent by reviewing the following detailed description of the invention.

BRIEF DESCRIPTION OF THE SEVERAL VIEWS OF THE DRAWINGS

In the following drawings, which form a part of the specification and which are to be construed in conjunction therewith, and in which like reference numerals have been employed throughout wherever possible to indicate like parts in the various views.

DETAILED DESCRIPTION OF THE INVENTION

Figure 1:
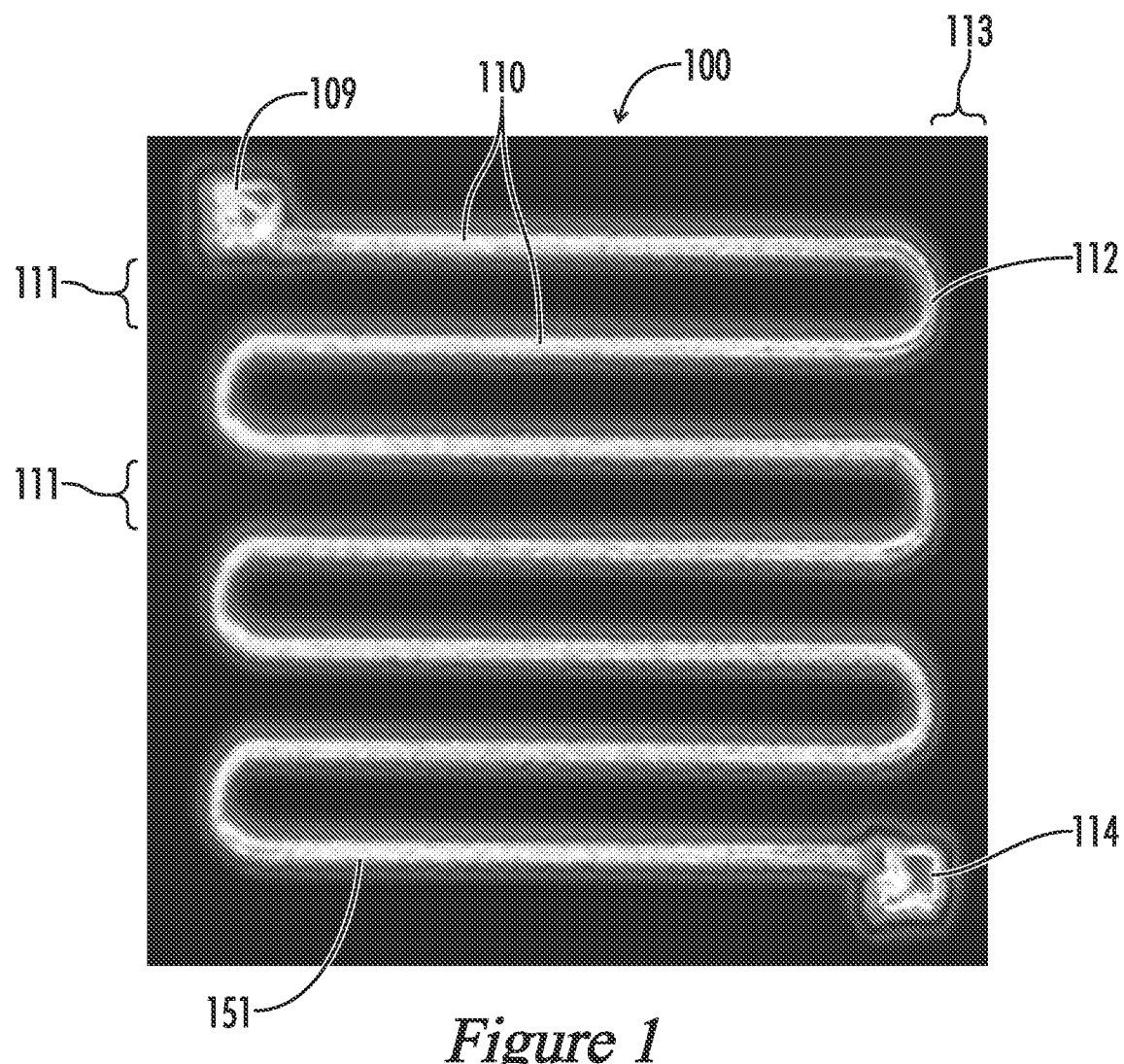
FIG. 1 is a computer-controlled aerosol-micro-jet-printer-positioned printed 100 um wide trace of conductive ink on an insulated print deposit area on a semiconducting substrate.

As shown in FIGS. 1 through 4 of the drawings, one exemplary embodiment of the present invention is generally shown as an interconnect routing pattern 100 printed on an insulated print deposit area 200 positioned on a semiconductor substrate 300 connecting discrete devices 400 shown as avalanche photo diodes 400. Advances in additive manufacturing such as 3D printers and aerosol jet printing are creating feature sizes useful for the patterning of semiconductor devices.

FIG. 1 shows an interconnect routing pattern 100 which is shown as a 100 µm wide resistive trace 151 of conductive ink printed on an insulated print deposit area 200. The interconnect routing pattern 100 is positioned in FIG. 3 on a silicon wafer substrate 300. The resistive trace 151 uses a resistive input pad 109 connected to parallel lines 110 maintaining an edge gap 113 and an internal line gap 111 for insulating purposes. The parallel lines 110 are connected by curved ends 112 positioned with an edge gap 113 to reach a resistive output pad 114. The insulated print deposit area 200, line gap 111, and edge gap 113 provide the necessary insulative clearances for the pathway. A single pass was used for printing. As advances in additive manufacturing tolerances and resolutions continue to improve, smaller and smaller semiconductor devices can be patterned, and reach submicron resolution used in semiconductor lithography today. At this resolution, steps that once required the production of reticles for semiconductor lithography can be replaced by computer control printing methods such as aerosol micro-jet, micro-syringe, etc. For example, the use of spin-on glass, spin-on glass dopants require the additional steps of photolithography such as application, development, baking-on, and removal of photoresists. These steps can be eliminated by printing the dopants on the wafer 300 directly to create the interconnect routing pattern 100. This application of micro-scale additive manufacturing greatly reduces the time and cost of creating prototypes of designs, for example the prototyping of large area lateral SiC diodes 500.

Figure 2:
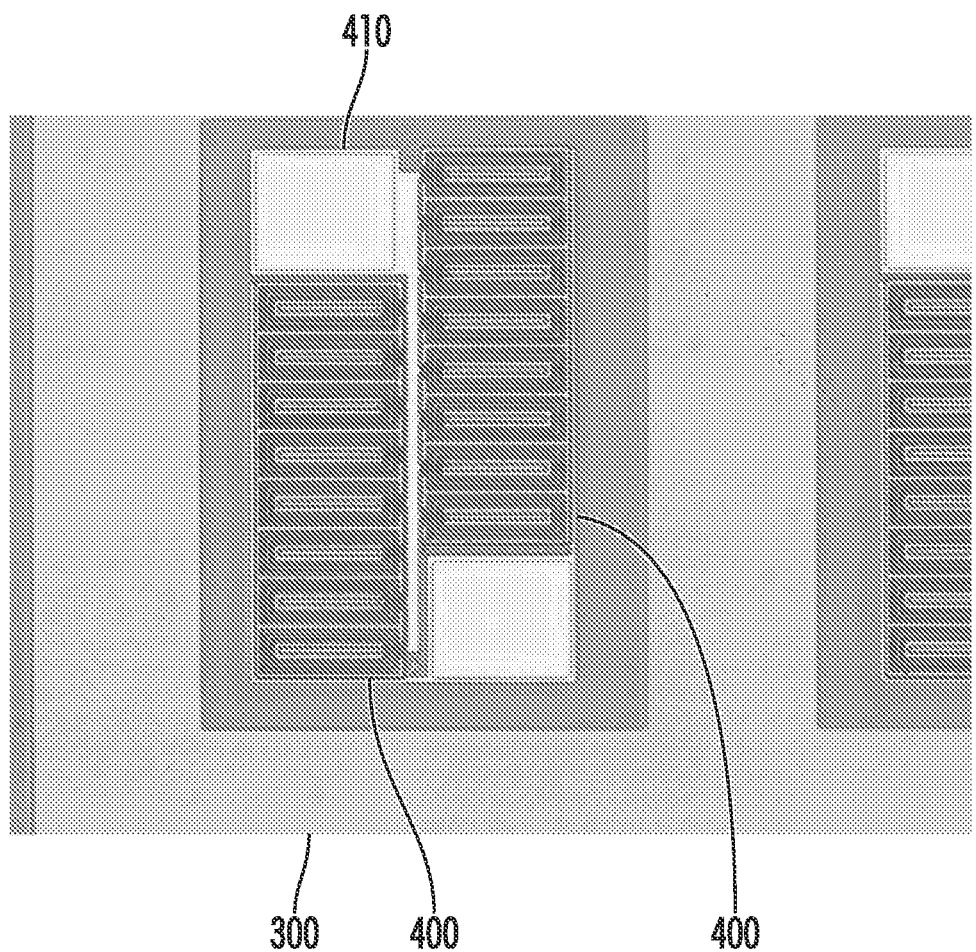
FIG. 2 shows lateral diodes patterned as discrete devices on a SiC substrate with an insulated print deposit area positioned for routing interconnects on a semiconducting substrate.
Figure 4:
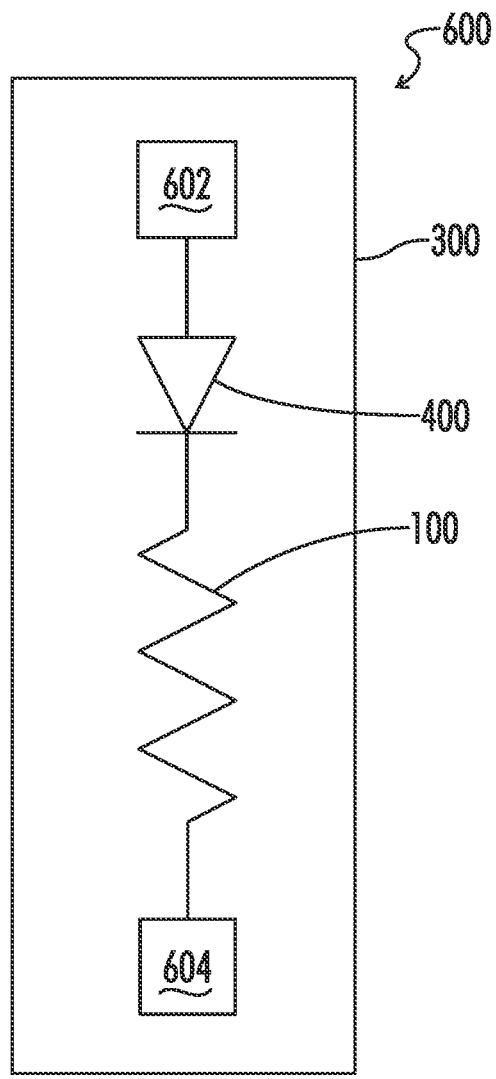
FIG. 4 shows an electrical schematic of the input to output for the wafer.

FIG. 2 shows lateral diodes 400 designed for avalanche photo-diode operation, APD, in a SiC process fabricated on a SiC wafer 300 in an array of discrete electrically isolated devices in a step and repeat pattern. Every device on the wafer is measured for its electrical and photonic characteristics. The characteristics of each APD are stored by wafer ID number an APD address in a measurement data base. An APD quench resistor value is calculated for each APD to homogenize the APD response across the wafer and wafer lots. FIG. 4 shows the basic electrical circuit schematic 600 with an off chip input pad 602 connected to the APD 400 which is then connected through the quench resistor made as a resistive trace 151 to the off chip output pad 604.

To implement large area lateral SiC diodes 500, individual semiconductor devices 400 are fabricated monolithically on a semiconducting substrate 300 also referred to as a wafer 300, and are tested using automated probe equipment. Each device 400 is given a specified address on the wafer 300. Once tested, each device 400 is segregated or binned based on performance criteria to create a wafer map of binned devices. Segregation can be made on pass/fail conditions or on performance ranging conditions. An interconnect routing pattern 100 is then generated to connect devices 400 of a common performance characteristic or pass/fail characteristic. The interconnect routing pattern 100 is specific to the yield of each wafer 300. The routing pattern 100 is applied to the wafer using additive manufacturing techniques such as micro-syringe dispensed ink or aerosol jet printed ink.

Figure 3:
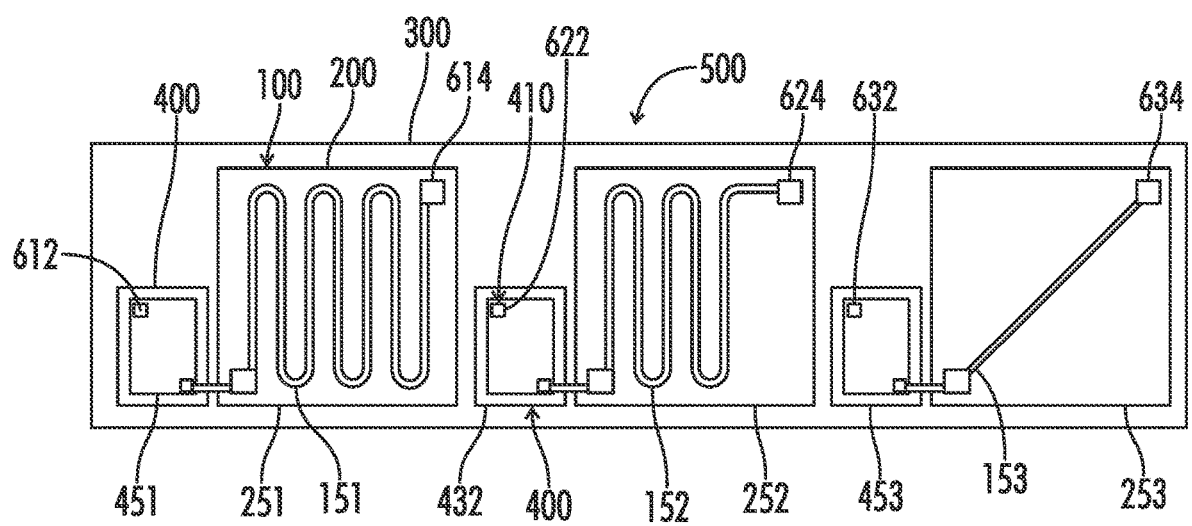
FIG. 3 shows varying length resistive interconnects printed on a semiconducting substrate.

FIG. 3 provides an example application to pattern lateral diodes 400 on a SiC substrate 300 using sub-micron resolved integrated circuit lithography as shown in FIG. 2. Other than the common substrate 300, these devices 400 are discrete devices and are not connected together. For scale in FIG. 2, the squares are connection pads 410 that are 100 um×100 um. The devices 400 are tested individually through an automated probing instrument, which is a common practice in mass production test. Once the devices 400 have been tested, their performance characteristics are used to create a wafer specific interconnect routing pattern 100, to connect them, for example in parallel or in series or to provide a resistive trace, depending on the applications. This routing pattern is applied to the wafer using additive manufacturing techniques such as computer-controlled aerosol micro-jet deposition of conductive ink as shown in FIG. 1.

As shown in FIG. 3, the unique resistor value for each APD 451, 452, 453 is printed as a unique resistive trace 151, 152, 153 using additive manufacturing equipment with resistive inks applied to the wafer as shown in FIG. 1. Each APD 451, 452, 453 and its unique quench resistor 151, 152, 153 are then connected with a jump trace 161, 162, 163 made from conductive inks using additive manufacturing. FIG. 3 shows the lateral diodes 451, 452, 453 connected with the conductive ink traces 151, 152, 153, 161, 162, 163 using additive manufacturing. Here we can see how customized additive manufacturing can be used for production on a multiple discrete element wafer 300. The wafer 300 in FIG. 3 is shown with a first avalanche diode 451, second avalanche diode 452, and third avalanche diode 453. We will assume that the measurements show that the first avalanche diode 451 needs a large resistive trace 151, the second avalanche diode 452 needs a smaller resistive trace 152 and the third avalanche diode 453 needs a minimum resistive trace 153. The conductive ink has a resistance per unit length such that longer traces provide more resistance and shorter traces provide less resistance. The first avalanche diode 451 circuit has a first input pad 612 and a first output pad 614 connected via a long first resistive trace 151 of conductive ink printed on a first insulated print deposit area 251 on the silicon wafer 300. The second avalanche diode 452 has a second input pad 622 and a second output pad 624 connected via a shorter second resistive trace 152 of conductive ink printed on a second insulated print deposit area 252 on the silicon wafer 300. The third avalanche diode 453 has a third input pad 632 and a third output pad 634 connected via a third resistive trace 153 of conductive ink printed on a third insulated print deposit area 253 on the silicon wafer 300. From this we can see that while the avalanche diodes 451, 452, 453 were all processed together, the additive manufacturing for the first, second, and third traces 151, 152, 153 allowed for customization after production of the wafer 300.

For this application the aerosol jet printer is an OPTPMEC AEROSOL JET 200 available from Optomec Inc. 3911 Singer Blvd. NE Albuquerque, N. Mex. 87109 USA. The aerosol jet printing process (AJP) works by atomizing an ink to produce dense aerosol droplets whose diameter ranges from 1 to 5 microns. The aerosol is moved to the head using an inert carrier gas that prevents the ink from coating/clogging the nozzle head. An annular sheath gas helps to focus the ink as it leaves the head, resulting in a high-velocity jet of material that can be deposited on planar or non-planar surfaces. The OptoMec Aerosol Jet 200 bench top system, designed for the evaluation of novel printable inks, utilizes an innovative aerodynamic focusing technology that prints structures ranging in size from 10 microns up to 2 mm.

Additionally, an NSCRYPT 3Dn Tabletop with a SmartPump 100 tip is used that is available from nScrypt Inc., 12151 Research Parkway, Suite 150, Orlando, Fla. 32826. The SmartPump™100 is a positive pressure pump with a high-precision computer actuated valve coupled with a precision nozzle. It gives the user precise flow rate control and discrete volumetric control down to 100 picoliters. The SmartPump100 can generate precise starts and stops, maintain a consistent material flow rate, and handle materials from 0 cP to 1,000,000 cP. More than 10,000 commercially available materials can be dispensed by the SmartPump100. The SmartPump100 is great for applications such as microelectronic packaging, resistive devices, heater coils, printed antennas, printed electronics, ceramic structures, and biomedical printing. The 3Dn Tabletop series features single-head or dual-head capability and is the smallest of the 3Dn line. Its ball screw/brushless servomotor stages provide 300 mm×150 mm of travel in the X and Y directions, respectively, at a maximum speed of 300 mm/s. The Z travel distance is 100 mm, with a maximum travel speed of 50 mm/s. The 3Dn Tabletop is equipped with a cast aluminum base plate.

Reference numerals used throughout the detailed description and the drawings correspond to the following elements:
- interconnect routing pattern 100
- resistive input pad 109
- parallel lines 110
- line gap 111
- curved end 112
- edge gap 113
- resistive output pad 114
- first resistive trace 151
- second resistive trace 152
- third resistive trace 153
- insulated print deposit area 200
- first insulated print deposit area 251
- second insulated print deposit area 252
- third insulated print deposit area 253
- semiconductor substrate 300
- discrete devices 400
- connection pads 410
- first avalanche diode 451
- second avalanche diode 452
- third avalanche diode 453
- large area lateral SiC diodes 500
- circuit schematic 600
- off chip input pad 602
- off chip output pad 604
- first input pad 612
- first output pad 614
- second input pad 622
- second output pad 624
- third input pad 632
- third output pad 634

From the foregoing, it will be seen that this invention well adapted to obtain all the ends and objects herein set forth, together with other advantages which are inherent to the structure. It will also be understood that certain features and subcombinations are of utility and may be employed without reference to other features and subcombinations. This is contemplated by and is within the scope of the claims. Many possible embodiments may be made of the invention without departing from the scope thereof. Therefore, it is to be understood that all matter herein set forth or shown in the accompanying drawings is to be interpreted as illustrative and not in a limiting sense.

When interpreting the claims of this application, method claims may be recognized by the explicit use of the word 'method' in the preamble of the claims and the use of the 'ing' tense of the active word. Method claims should not be interpreted to have particular steps in a particular order unless the claim element specifically refers to a previous element, a previous action, or the result of a previous action. Apparatus claims may be recognized by the use of the word 'apparatus' in the preamble of the claim and should not be interpreted to have 'means plus function language' unless the word 'means' is specifically used in the claim element. The words 'defining,' having,' or 'including' should be interpreted as open ended claim language that allows additional elements or structures. Finally, where the claims recite "a" or "a first" element of the equivalent thereof, such claims should be understood to include incorporation of one or more such elements, neither requiring nor excluding two or more such elements.

What is claimed is:

1. A method for producing a silicon carbide wafer, comprising:
    providing a first avalanche diode and a second avalanche diode on a silicon carbide wafer substrate;
    providing a first output pad and a second output pad on the silicon carbide wafer substrate, the first output pad electrically connected to the first avalanche diode and the second output pad electrically connected to the second avalanche diode;
    providing a first input pad, a first resistive trace area, a second input pad, and a second input trace area on the silicon carbide wafer substrate,
    measuring a first needed resistance for the first avalanche diode and a second needed resistance for the second avalanche diode;
    printing a first resistive conductive ink trace in the first resistive trace area, the first resistive trace having a length sufficient to provide the first needed resistance; and
    printing a second resistive conductive ink trace in the second resistive trace area, the second resistive trace having a length sufficient to provide the second needed resistance.

* * * * *